(12) United States Patent
Koyama

(10) Patent No.: US 8,414,013 B2
(45) Date of Patent: Apr. 9, 2013

(54) HOUSING STRUCTURE FOR IN-VEHICLE ELECTRONIC DEVICE

(75) Inventor: Takeshi Koyama, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 260 days.

(21) Appl. No.: 12/724,980

(22) Filed: Mar. 16, 2010

(65) Prior Publication Data

US 2010/0253188 A1    Oct. 7, 2010

(30) Foreign Application Priority Data

Apr. 3, 2009   (JP) .................................. 2009-091597

(51) Int. Cl.
*B60R 21/01* (2006.01)

(52) U.S. Cl.
USPC ........ 280/727; 280/735; 312/223.1; 361/752; 361/730; 439/301; 174/50.52

(58) Field of Classification Search ............... 312/223.1; 361/736, 752, 730, 800, 816, 818; 340/426.34; 439/301, 302; 248/201; 280/728.2, 735, 280/731; 174/387, 50, 50.52
See application file for complete search history.

(56) References Cited

U.S. PATENT DOCUMENTS

| | | | | |
|---|---|---|---|---|
| 5,505,483 A * | 4/1996 | Taguchi et al. | ............ | 280/728.2 |
| 6,247,726 B1 * | 6/2001 | Ryan | .............. | 280/739 |
| 6,302,190 B1 * | 10/2001 | Clamp et al. | ................. | 165/80.4 |
| 6,362,971 B1 * | 3/2002 | Skofljanec | ................ | 361/752 |
| 6,628,523 B2 * | 9/2003 | Kobayashi et al. | .......... | 361/736 |
| 6,669,505 B2 * | 12/2003 | Wisniewski | ................. | 439/521 |
| 6,717,051 B2 * | 4/2004 | Kobayashi et al. | .......... | 174/535 |
| 6,781,847 B2 * | 8/2004 | Jakob et al. | ................... | 361/752 |
| 7,441,805 B2 * | 10/2008 | Jamison et al. | ............ | 280/743.2 |
| 7,510,404 B2 * | 3/2009 | Koyama | ....................... | 439/76.1 |
| 7,729,117 B2 * | 6/2010 | Schweinbenz et al. | ........ | 361/699 |
| 7,922,200 B2 * | 4/2011 | Webber | ....................... | 280/743.2 |
| 8,096,576 B2 * | 1/2012 | Azuma | ....................... | 280/728.2 |
| 2002/0149918 A1 * | 10/2002 | Koyama | ....................... | 361/752 |
| 2005/0127653 A1 * | 6/2005 | Williams et al. | ........... | 280/743.2 |
| 2009/0268414 A1 * | 10/2009 | Lu | ................................. | 361/736 |
| 2010/0078918 A1 * | 4/2010 | Azuma | ....................... | 280/728.2 |
| 2010/0182757 A1 * | 7/2010 | Hiros | ............................. | 361/752 |
| 2010/0253188 A1 * | 10/2010 | Koyama | ..................... | 312/223.1 |
| 2011/0085307 A1 * | 4/2011 | Burgi et al. | .................. | 361/752 |
| 2011/0170269 A1 * | 7/2011 | Blossfeld et al. | ............. | 361/752 |
| 2011/0235290 A1 * | 9/2011 | Luhr et al. | .................... | 361/752 |

FOREIGN PATENT DOCUMENTS

| | | |
|---|---|---|
| JP | 09-207706 | * 12/1997 |
| JP | A-2002-308021 | 10/2002 |
| JP | A-2006-306307 | 11/2006 |

* cited by examiner

*Primary Examiner* — Paul N Dickson
*Assistant Examiner* — Karen Beck
(74) *Attorney, Agent, or Firm* — Oliff & Berridge, PLC

(57) ABSTRACT

A housing structure for an in-vehicle electronic device is provided. A case body includes a top panel and a side wall continuously and integrally formed at a side edge of the top panel. The case body is configured to accommodate a control board therein. A plurality of brackets outwardly projects and extends from the side wall of the case body. The brackets are fixed to an attachment portion of a vehicle body. A plurality of reinforcement ribs are integrally formed between the brackets and the side wall of the case body at a position lower than the control board in a state where the case body is mounted on the vehicle body.

9 Claims, 12 Drawing Sheets

HOUSING STRUCTURE FOR IN-VEHICLE ELECTRONIC DEVICE

The disclosure of Japanese Patent Application No. 2009-091597 filed on Apr. 3, 2009 including specification, drawings and claims is incorporated herein by reference in its entirety.

BACKGROUND

The present invention relates to a housing structure, in particular to a housing structure which can be favorably employed for a in-vehicle electronic device such as an airbag Electronic Control Unit (ECU).

FIG. 1 is an exploded perspective view illustrating an airbag ECU to which a housing structure for an in-vehicle electronic device according to a first related art is applied. For example, Patent Document 1 discloses the first related art. The airbag ECU is mounted on a vehicle. The airbag ECU controls a gas generator so as to activate the gas generator when detecting a shock to a vehicle body due to a collision to supply the gas from the gas generator to an airbag.

The airbag ECU 1 includes a housing 4 which has a case body 2 and three brackets 3a, 3b, 3c integrally formed in the case body 2 for mounting the case body 2 on the vehicle body. The airbag ECU 1 further includes a control board 6 which is an in-vehicle electronic device on which an acceleration sensor for detecting the shock due to the collision is mounted, a lid 8 which is fixed to the housing 4 with a plurality of bolts 7 when the control board 6 is accommodated in the housing 4, and a connector 10 fitted into a fitting recess 9 formed at one side of the housing 4.

Functions required for the housing 4 are as follows: (1) precisely transmitting the shock due to the collision of the vehicle to the acceleration sensor mounted on the control board 6; and (2) protecting the control board 6 from an external load applied to the housing 4 due to the collision of the vehicle so that the control board 6 can continue to function normally even after the collision.

Regarding the second function (2) of these two functions required for the housing 4, Patent Document 2 discloses a second related art. According to the second related art, the brackets 3a, 3b, 3c is intentionally designed to be broken by the shock transmitted from the vehicle body to the housing 4 to protect the control board 6. In this structure, each of the brackets 3a, 3b, 3c is broken at a position lower than a mounting position of the control board 6 in the housing 4. In other words, each of the bracket 3a, 3b, 3c is broken at its base end side. Accordingly, a metal piece generated when each of the brackets 3a, 3b, 3c is broken does not fall on the control board 6, thereby preventing a circuit of the control board 6 from being broken.

Since the airbag ECU 1 is mounted on any vehicle as a standard equipment, an outer shape of the airbag ECU 1 and a attachment structure to the vehicle body are standardized. In a model change of the airbag ECU 1, the control board or the housing 4 may be required to be reduced in size. However, if the attachment structure of each bracket 3a, 3b, 3c to the vehicle is changed in the model change, it is necessary to also change the standard of the attachment structure or change the structure of the vehicle body. Accordingly, even in such a model change, the attachment structure of the housing 4 to the vehicle body is not changed and only an attachment portion of the control board 6 to the housing 4 may be reduced in size.

FIG. 2 is a top plan view for explaining a change of the structure of an airbag ECU 10 according to a third related art due to the downsizing. FIG. 3 is a perspective view for explaining the change of the structure of the airbag 10 shown in FIG. 2. In FIG. 2, the airbag ECU 1 according to the first and second related arts is represented in solid lines and the airbag ECU 10 according to the third related art is represented in dashed lines.

In accordance with a requirement for further cost reduction of the airbag ECU 1, a control board 11 of the airbag ECU 10 according to the third related art is reduced in size relative to the control board 6 according to the first and second related arts. In a housing 15 of the airbag ECU 10, fixing positions 12a, 12b, 12c to be fixed to the vehicle body with fixing means such as bolts and the case body 13 which is reduced in size in accordance with the downsized control board 11 are connected by long brackets 14a, 14b, 14c. Accordingly, gap between each fixing position 12a, 12b, 12c and the case housing 13 becomes large.

In such an airbag ECU 10 according to the third related art, since each bracket 14a, 14b, 14c is relatively long, transmissibility of the shock is reduced. In order to solve such a problem, a fourth related art discloses an airbag ECU 16 which employs a housing 18 in which flange portions 17a, 17b continuously and integrally formed between the brackets 14a, 14b, 14c in a single surface, as shown in a perspective view of FIG. 4.

Further, as shown in a perspective view of FIG. 5, a fifth related art discloses, as another reinforcement configuration, an airbag ECU 22 which employs a housing 21 in which ribs 20a, 20b, 20c are integrally formed between each of the brackets 14a, 14b, 14c and the case body 13.

Patent Document 1: Japanese Patent Publication No. 2006-306307A

Patent Document 2: Japanese Patent Publication No. 2002-308021A

In the above describe fourth related art, since the flange portions 17a, 17b are integrally formed between each bracket 14a, 14b, 14c in the housing 18, the weight of the airbag ECU 19 increases, and thus the manufacturing cost also increases.

In the fifth related art, each rib 20a, 20b, 20c are integrally formed between each bracket 14a, 14b, 14c and the case body 13 in the housing 21. When the airbag ECU 22 is mounted on a vehicle and the shock is applied to the housing 21 due to the collision of the vehicle, the impact force is transmitted to the case body 13 through each bracket 14a, 14b, 14c and each rib 20a, 20b, 20c, and thus the case body 13 may be broken at a position upper than higher than the control board 6, i.e. a position at a side of a top plate 23. Therefore, as well as the first related art, the fifth related art has a problem that scattered articles such as a metal piece, generated due to the breakage of the case body 13 may fall on the control board 6 and the circuit of the control board 6 may be broken. In addition, since each bracket 14a, 14b, 14c are reinforced by each rib 2a, 20b, 20c, the brackets 14a, 14b, 14c have high rigidity. Therefore, the shock transmission performance from each bracket 14a, 14b, 14c to the case body 13 may be reduced.

SUMMARY

It is therefore an object of at least one embodiment of the present invention to provide a housing structure for an in-vehicle electronic device, which is capable of surely protecting a control board and preventing a shock transmission performance from being reduced.

In order to achieve the above described object, according to an aspect of at least one embodiment of the present invention, there is provided a housing structure for an in-vehicle electronic device, comprising: a case body including: a top panel;

and a side wall continuously and integrally formed at a side edge of the top panel; a plurality of brackets outwardly projecting and extending from the side wall of the case body and being fixed to an attachment portion of a vehicle body; and a plurality of reinforcement ribs integrally formed between the brackets and the side wall of the case body at a position lower than a control board which is accommodated in the case body in a state where the case body is mounted on the vehicle body.

With the above configuration, the control board on which an electric/electronic component such as an acceleration sensor or a Central Processing Unit (CPU) is mounted is accommodated in the case body, the brackets are fixed to the attachment portion of the vehicle body with fixing means such as bolts, and the reinforcement ribs are integrally formed between each bracket and the side wall at the position lower than the control board accommodated in the case body.

When the vehicle body receives a shock due to a collision of a vehicle, the shock is transmitted to the case body through each bracket. Since the reinforcement ribs are integrally formed between each bracket and the side wall at the position lower than the control board, even when each bracket is broken and a stress doe to the shock is transmitted from each bracket to the side wall of the case body, the breakage (a crack) generated from an opening peripheral edge portion of the side wall does not progress beyond a position over the control board or a position in the vicinity of the control board. Accordingly, a metal piece generated due to the breakage does not scatter or fall on the control board, the control board is not exposed to the outside through an opening formed by the breakage of the side wall, thereby preventing a circuit of the control board from being broken by short circuit.

According to another aspect of at least one embodiment of the present invention, there is provided a housing structure for an in-vehicle electronic device, comprising: a case body configured to accommodate a board therein; and a reinforcement member outwardly projecting from a side wall of the case body, wherein the reinforcement member is positioned lower than the board in a state where the case body is mounted on a vehicle body.

According to the above aspects of at least one embodiment of the present invention, it is possible to achieve a housing for the in-vehicle electronic device, having improved reliability. Since a plurality of reinforcement ribs are integrally formed between each bracket and a height position of the control board in the side wall of the case body, even when the shock due to the collision of the vehicle breaks the brackets, the control board can be prevented from being broken.

BRIEF DESCRIPTION OF THE DRAWINGS

The above objects and advantages of the present invention will become more apparent by describing in detail preferred exemplary embodiments thereof with reference to the accompanying drawings, wherein:

FIG. 9A is a schematic cross-sectional view illustrating the crack generation position m1 in a state where a crack is generated at the crack generation position m1 higher than a control board 6; and FIG. 9B is a schematic cress-sectional view illustrating the crack generation position m2 in a state where a crack is generated at the crack generation position m2 lower than the control board 6;

DETAILED DESCRIPTION OF THE EMBODIMENTS

Hereinafter, exemplary embodiments will be described with reference to the accompanying drawings.

Figure 6:
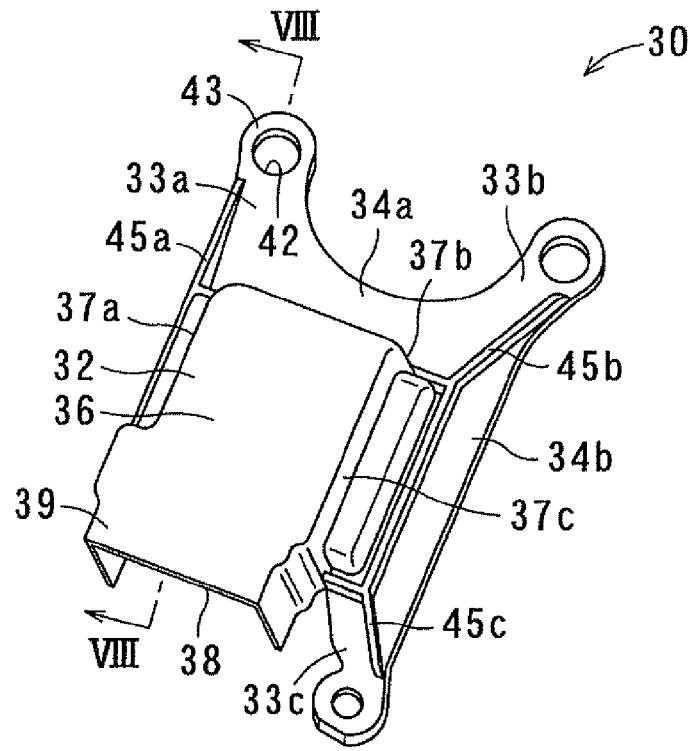
FIG. 6 is a perspective view illustrating a housing 30 employing a housing structure for an in-vehicle electronic device according to an embodiment of the present invention.
Figure 7:
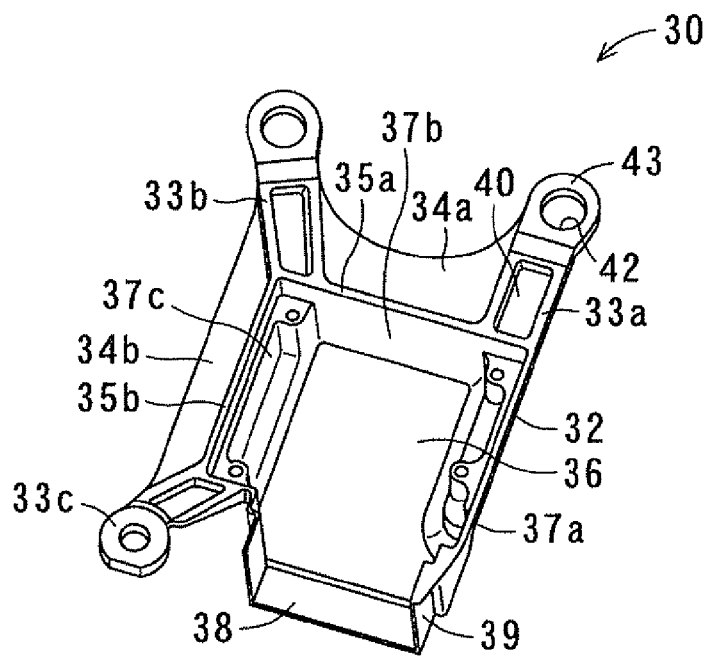
FIG. 7 is a perspective view illustrating the housing 30 shown in FIG. 6 when viewed from behind.

FIG. 6 is a perspective view illustrating a housing 30 to which a housing structure for an in-vehicle electronic device according to an embodiment of the present invention is applied. FIG. 7 is a perspective view illustrating the housing 30 shown in FIG. 6 when viewed from behind the housing 30. The embodiment is directed to the housing 30 for an airbag Electronic Control Unit (ECU) mounted on a vehicle. The airbag ECU controls a gas generator so as to activate the gas generator and supply gas from the gas generator to an airbag when detecting a shock to a vehicle body due to a collision of the vehicle. Basic configuration and functions of this airbag ECU is the same as that of the above-described airbag ECU 1 shown in FIG. 1, and thus repetitive explanation thereof will be omitted.

The housing 30 includes a box-shaped case body 32, first to third brackets 33a, 33b, 33c, a thin plate-shaped first flange portion 34a, a thin plate-shaped second flange portion 34b, a first projection portion 35a and a second projection portion 35b. The case body 32 is opened at one side portion. The first to third brackets 33a, 33b, 33c extend in an out-of-plane direction from three corner portions of an opening peripheral edge portion of the case body 32. The first flange portion 34a is continuously formed between the first bracket 33a and the second bracket 33b. The second flange portion 35a is continuously formed between the second bracket 33b and the third bracket 33c. The first projection portion 35a is formed at an intersection portion of a part of the opening peripheral edge portion of the case body 32 between the first and second brackets 33a, 33b and a base end portion of the first flange 34a. The first projection portion 35a projects from an imaginary surface including a lower surface of the first flange portion 34a and is formed in a line. The second projection portion 35b is formed at an intersection portion of a part of the opening peripheral edge portion of the case body 32 between the second and third brackets 33b, 33c and a base end portion of the second flange 34b. The second projection portion 35b projects from an imaginary surface including a lower surface of the second flange portion 34b and is formed in a line.

Figure 1:
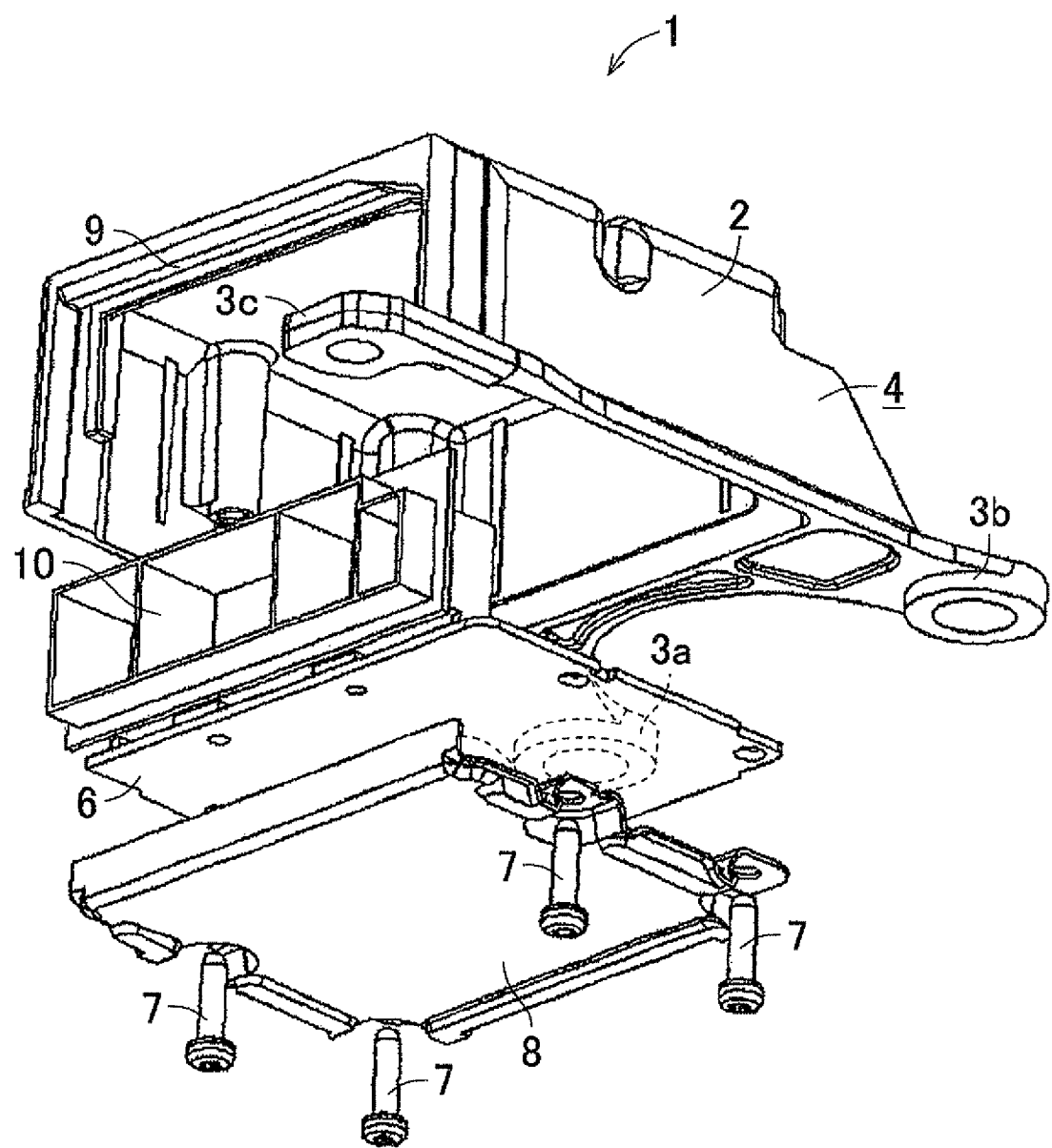
FIG. 1 is an exploded perspective view illustrating an airbag ECU 1 employing a housing structure for an in-vehicle electronic device according to a first related art.
Figure 2:
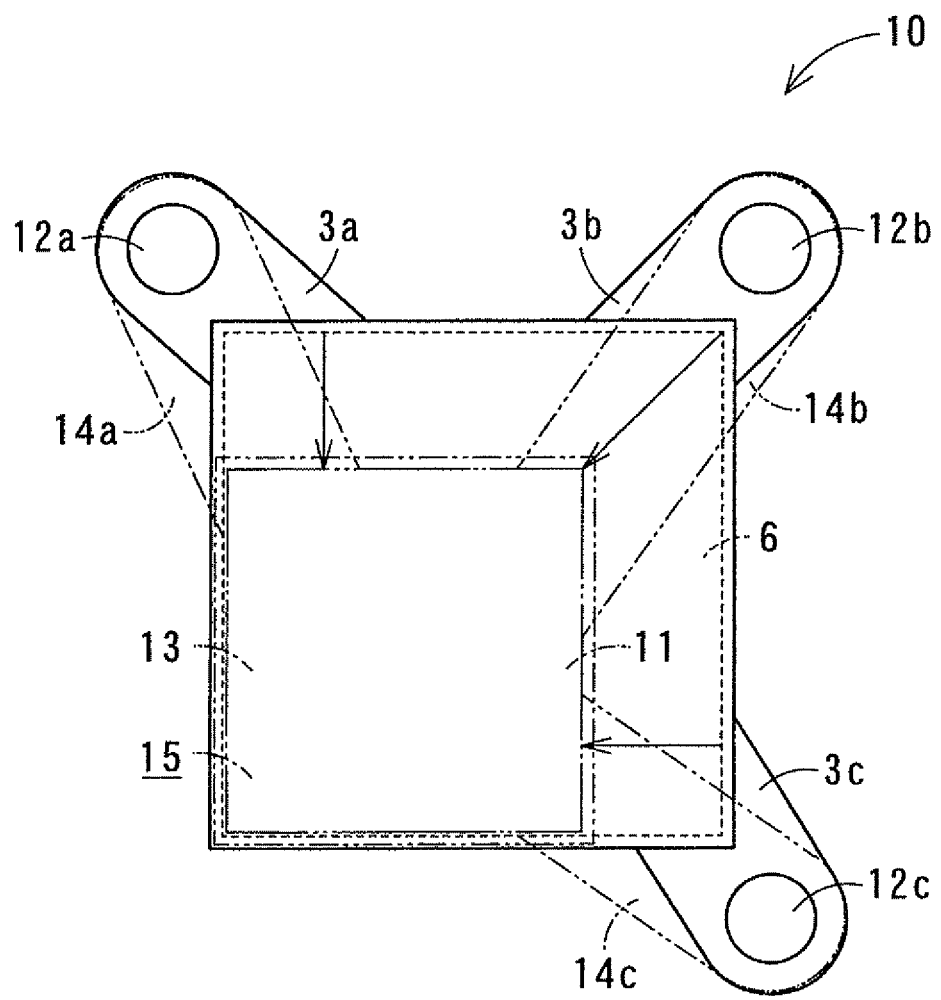
FIG. 2 is a top plan view for explaining a change of the structure of an airbag ECU 10 according to a third related art due to downsizing.

The case body 32 includes a top plate 36, first to third side walls 37a, 37b, 37c, and a fitting recess portion 39. The top plate 36 is substantially parallel with the first and second flange portions 34a, 34b. The first to third side walls 37a, 37b, 37c are continuously and integrally formed with three side edge portions of the top plate 36 at right angle with the top plate 36. The fitting recess portion 39 is formed at an opposite side to the second side wall 37b in the first and third side walls 37a, 37c. The fitting recess portion 39 has a concave-shaped cross section and is formed with a fitting recess 38 into which the above-mentioned connector 10 shown in FIG. 1 is fitted.

The first flange portion 34a is integrally connected to an opening edge portion of the second side wall 37b which constitute a part of the opening peripheral edge portion of the case body 32 and is formed into a concave shape toward an in-plane direction over the first bracket 33a and the second bracket 33b. The second flange portion 34b is integrally connected to an opening edge portion of the third side wall 37c which constitutes a part of the opening peripheral edge portion of the case body 32 and is formed into a concave shape toward an in-plane direction over the second bracket 33b and the third bracket 33c.

The housing 30 is made of aluminum die casting having lightweight, high electrical conductivity, high heat conductivity, and superior corrosion resistance.

Figure 8:
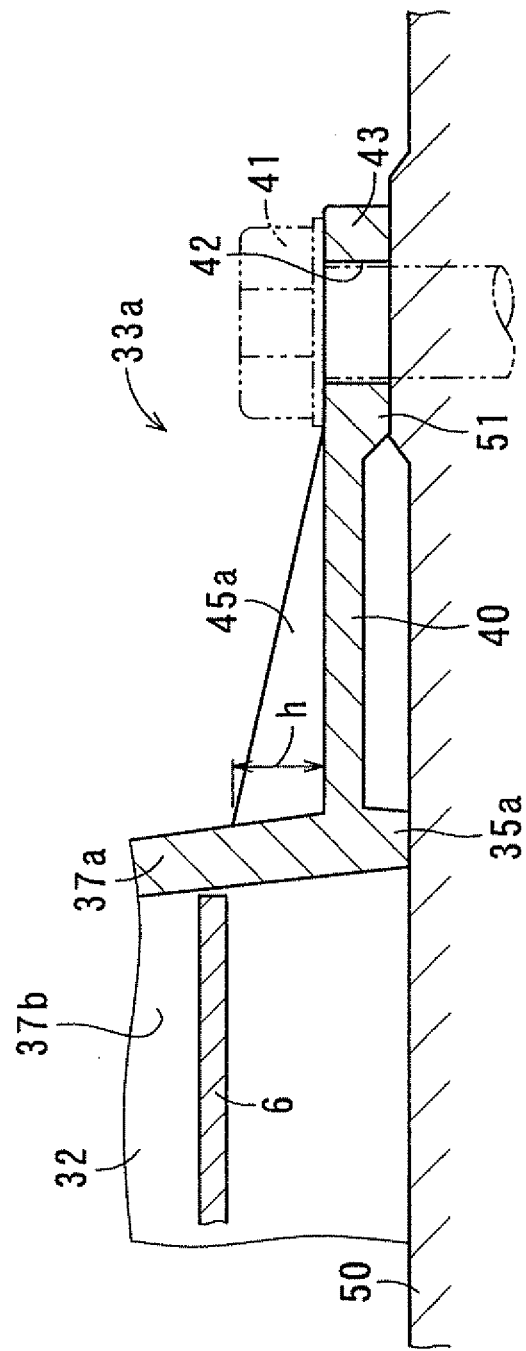
FIG. 8 is an enlarged cross-sectional view taking along the line VIII-VIII shown in FIG. 6.

FIG. 8 is an exploded cross sectional view taking along the line VIII-VIII shown in FIG. 6. The first bracket 33a extends in an out-of-plane direction from the opening peripheral edge portion of the case 32 at an intersection portion of the first side wall 37a and the second side wall 37b. The first bracket 33a includes a flat-shaped arm portion 40 and a leg portion 43 integrally formed in an free end of the arm portion 40 and fixed to an attachment portion 50 of the vehicle body with an attachment bolt 41. A bolt insertion hole 42 for inserting a shaft portion of the attachment bolt 41 therethrough is formed in the leg portion 43. As well as the first bracket 33a, each of the second and third brackets 33b, 33c also includes an arm portion 40 and a leg portion 43. The first and second brackets 33a, 33b are disposed at a front side of the vehicle and the third bracket 33c is disposed at a rear side of the vehicle. The housing 30 is fixed to the vehicle such that the opening peripheral edge portion of the case body 32 is directed to a lower side of the vehicle.

Each leg portion 43 of the first to third brackets 33a, 33b, 33c is integrally formed with a thick-walled portion 51 projecting toward the attachment portion 50 relative to a lower face of each arm portion 40. With the thick-walled portion, even if a chipped portion is unintentionally formed when removing burr occurred during metal molding of the housing 30, it is possible to prevent undesirable decrease in strength below a predetermined strength required to expand the airbag.

Each upper surface of the first to third brackets 33a, 33b, 33c is integrally formed with each reinforcement ribs 45a, 45b, 45c between each leg portion 43 and each side wall 37a, 37b, 37c. The first reinforcement rib 45a is formed on the first bracket 33a and is integrally connected to an intersection portion of the first side wall 37a and the second side wall 37b in a position at a side of the opening peripheral edge portion relative to the control board 6 accommodated in the case body 32. In other words, the first reinforcement rib 45a is integrally formed between the first bracket 33a and the first side wall 37a of the case body 32 at a position lower than the control board 6 accommodated in the case body 32 when the case body 32 is mounted on the vehicle body.

The second reinforcement rib 45b is formed on the second bracket 33b and is integrally connected to an intersection portion of the second side wall 37b and the third side wall 37c in a position at a side of the opening peripheral edge portion relative to the control board 6 accommodated in the case body 32. In other words, the second reinforcement rib 45b is integrally formed between the second bracket 33b and the second side wall 37b of the case body 32 at a position lower than the control board 6 when the case body 32 is mounted on the vehicle body. The third reinforcement rib 45c is formed on the third bracket 33c and is integrally connected to an end portion of the third side wall 37c farthest in a circumferential direction in a position at a side of the opening peripheral edge portion relative to the control board 6 accommodated in the case body 32. In other words, the third reinforcement rib 45c is integrally formed between the third bracket 33c and the third side wall 37c of the case body 32 at a position lower than the control board 6 when the case body 32 is mounted on the vehicle body.

Accordingly, at least in the vicinity of the first to third side walls 37a, 37b, 37c, an upper face of each of the first to third reinforcement ribs 45a, 45b, 45c is positioned lower than a lower face of the control board 6 accommodated in the case body 32.

Figure 9A:
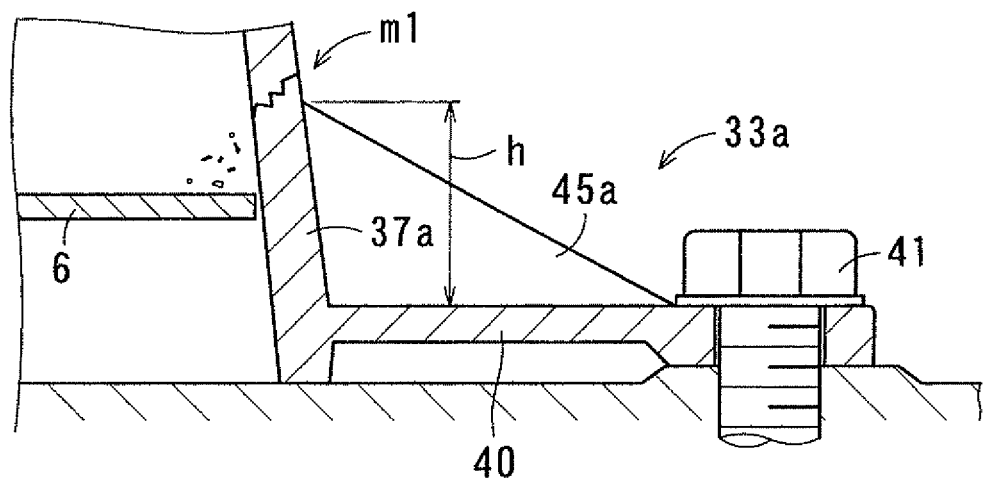
FIGS. 9A and 9B are schematic cross-sectional views illustrating a difference between an crack generation position m1 and a crack generation position m2 in accordance with a height position h of reinforcement ribs 45a, 45b, 45.
Figure 9B:
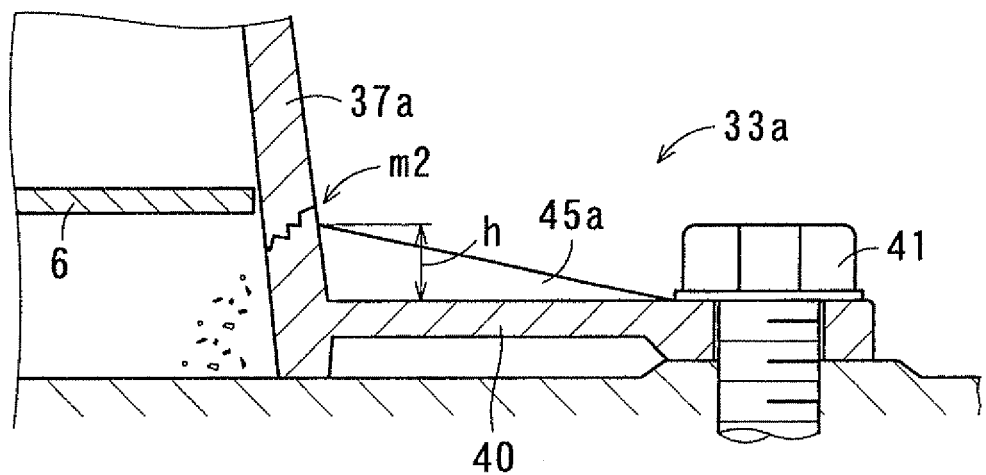

FIGS. 9A and 9B are schematic cross-sectional views illustrating a difference between an crack generation position m1 and a crack generation position m2 in accordance with a height position h of reinforcement ribs 45a, 45b, 45. FIG. 9A is a schematic cross-sectional view illustrating the crack generation position m1 in a state where a crack is generated at the crack generation position m1 higher than a control board 6. FIG. 9B is a schematic cress-sectional view illustrating the crack generation position m2 in a state where a crack is generated at the crack generation position m2 lower than the control board 6. In this embodiment, the height h of each reinforcement rib 45a, 45b, 45c from each upper surface of each bracket 33a, 33b, 33c is lower than an attachment position of the control board 6 to the case body 32, i.e. the height h is limited such that the ribs 45a, 45b, 45 are disposed at a lower side of the vehicle body in a state where the housing 30 is mounted on the vehicle body. With this configuration, even when a large stress due to the shock of the collision of the vehicle is transmitted from each bracket 33a, 33b, 33c to each side walls 37a, 37b, 37c of the case body 32 and a crack is generated in a first side wall 37a, this crack is not formed at a crack generation position m1 which is disposed over the attachment position of the control board 6 at a side of the top panel 36, as shown in FIG. 9A, but rather formed at a crack generation position m2 which is disposed below the attachment position of the control board 6, as shown in FIG. 9B. Accordingly, a broken piece of the case body 32, which is generated by this breakage does not fall on the control board 6, and thus the control board 6, a circuit wiring formed on the control board 6, and various mounted components such as an acceleration sensor and a Central Processing Unit (CPU) mounted on the control board 6 are prevented from being broken by short circuit, or the like. Therefore, even at the time of the collision of the vehicle, the control board 6 continues to function normally to expand the airbag.

Figure 10:
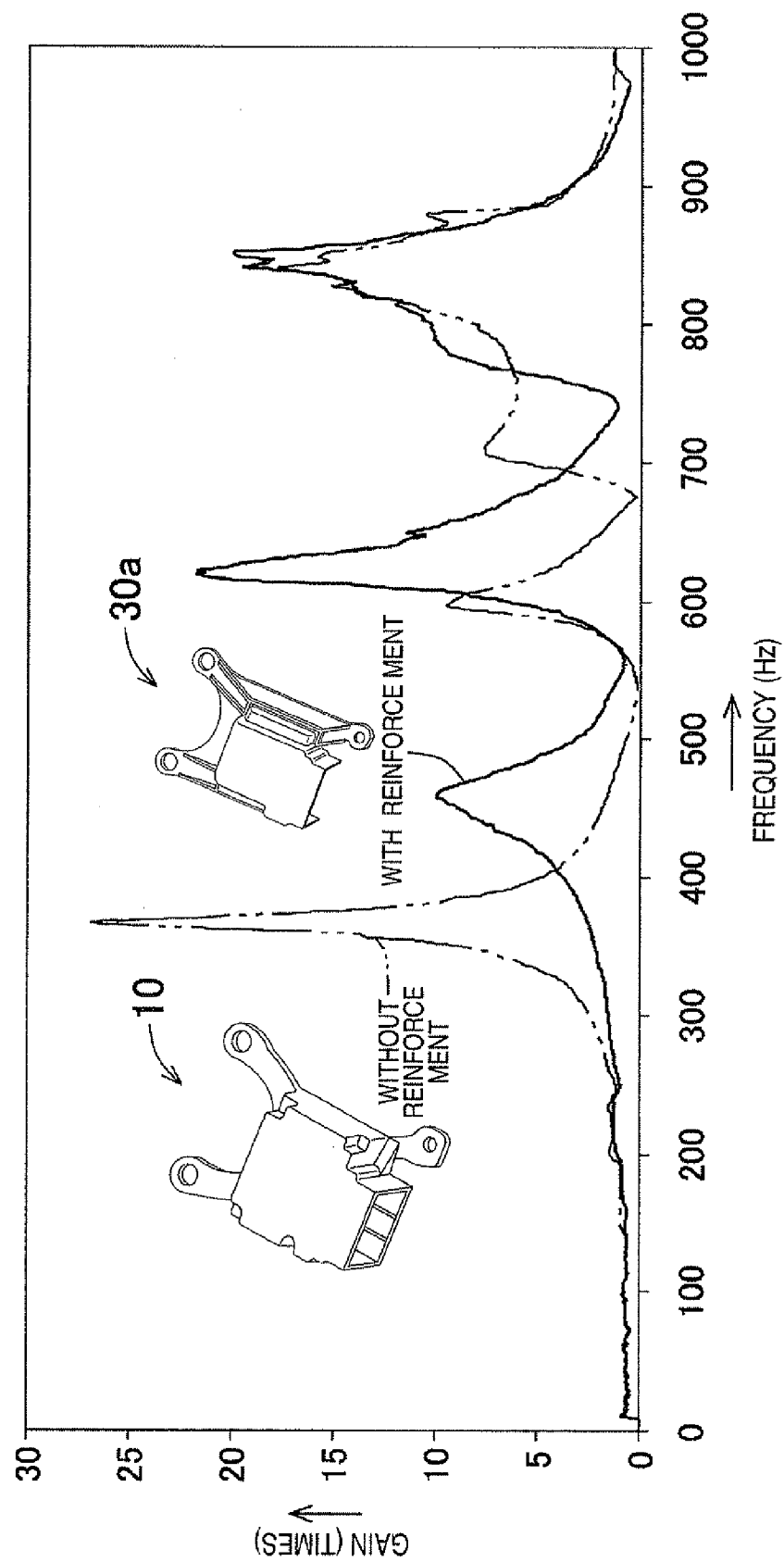
FIG. 10 is a graph illustrating frequency characteristic detected by an acceleration sensor in a sensitive direction X when the airbag ECU is vibrated in the vertical direction.
Figure 11:
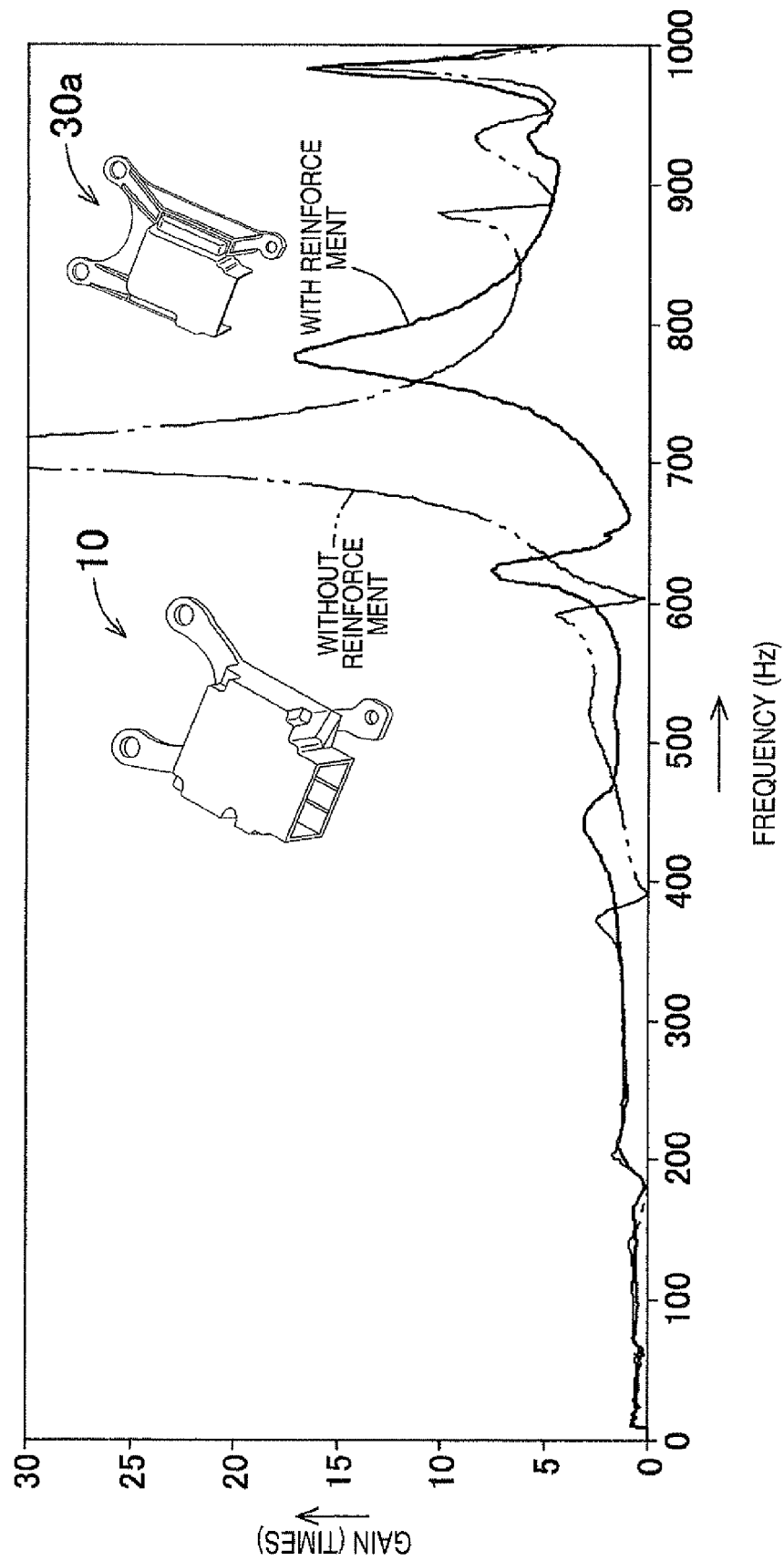
FIG. 11 is a graph illustrating frequency characteristic detected by the acceleration sensor in a sensitive direction Y when the airbag ECU is vibrated in the vertical direction.
Figure 12:
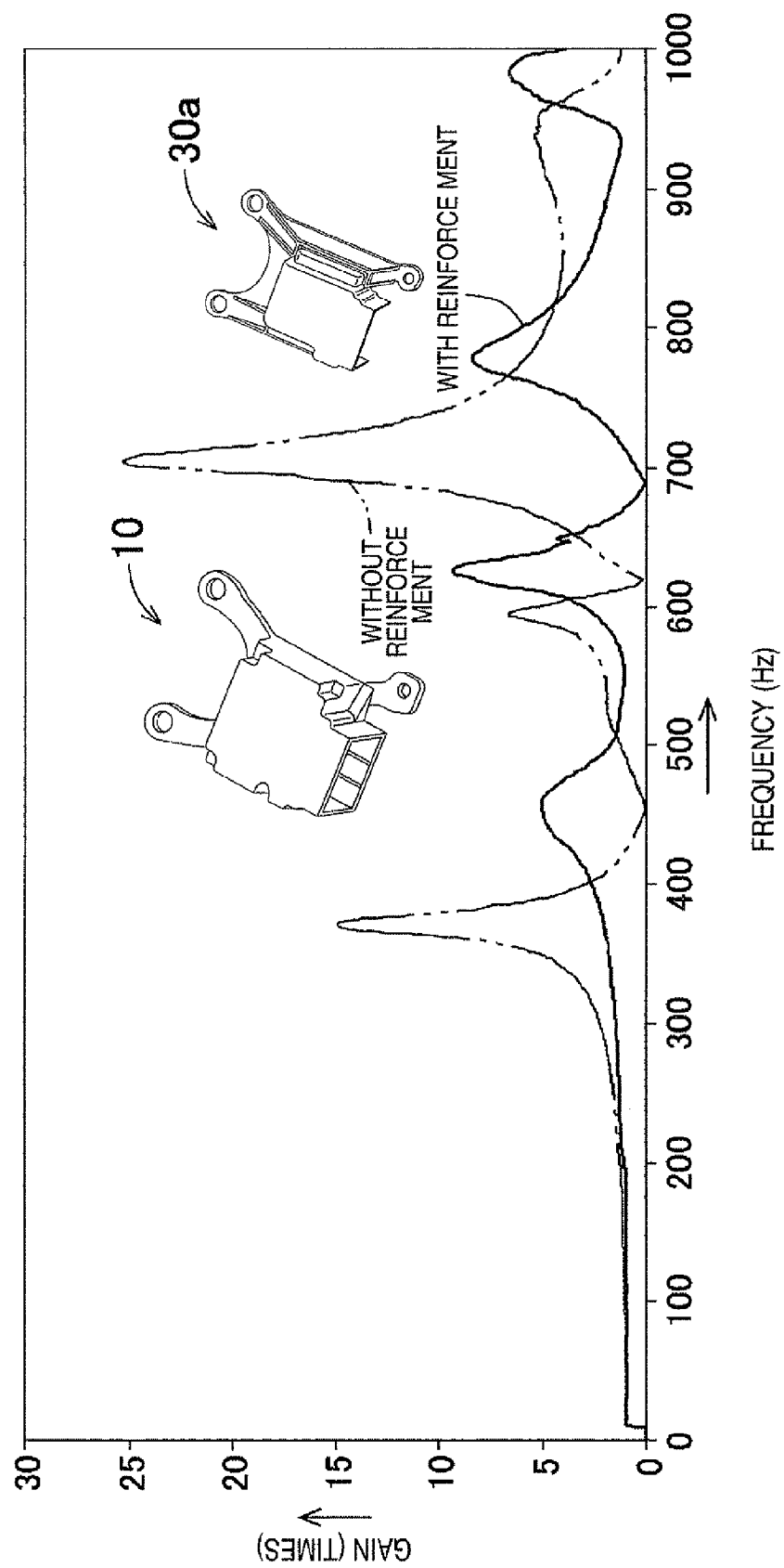
FIG. 12 is a graph illustrating frequency characteristic detected by the acceleration sensor in a sensitive direction Z when the airbag ECU is vibrated in the vertical direction.

FIG. 10 is a graph illustrating frequency characteristic detected by an acceleration sensor in a sensitive direction X when the airbag ECU is vibrated in the vertical direction. FIG. 11 is a graph illustrating frequency characteristic detected by the acceleration sensor in a sensitive direction Y when the airbag ECU is vibrated in the vertical direction. FIG. 12 is a graph illustrating frequency characteristic detected by the acceleration sensor in a sensitive direction Z when the airbag ECU is vibrated in the vertical direction. In FIGS. 10 to 12, the vertical axis represents a frequency and the horizontal axis represents a resonance gain.

Figure 3:
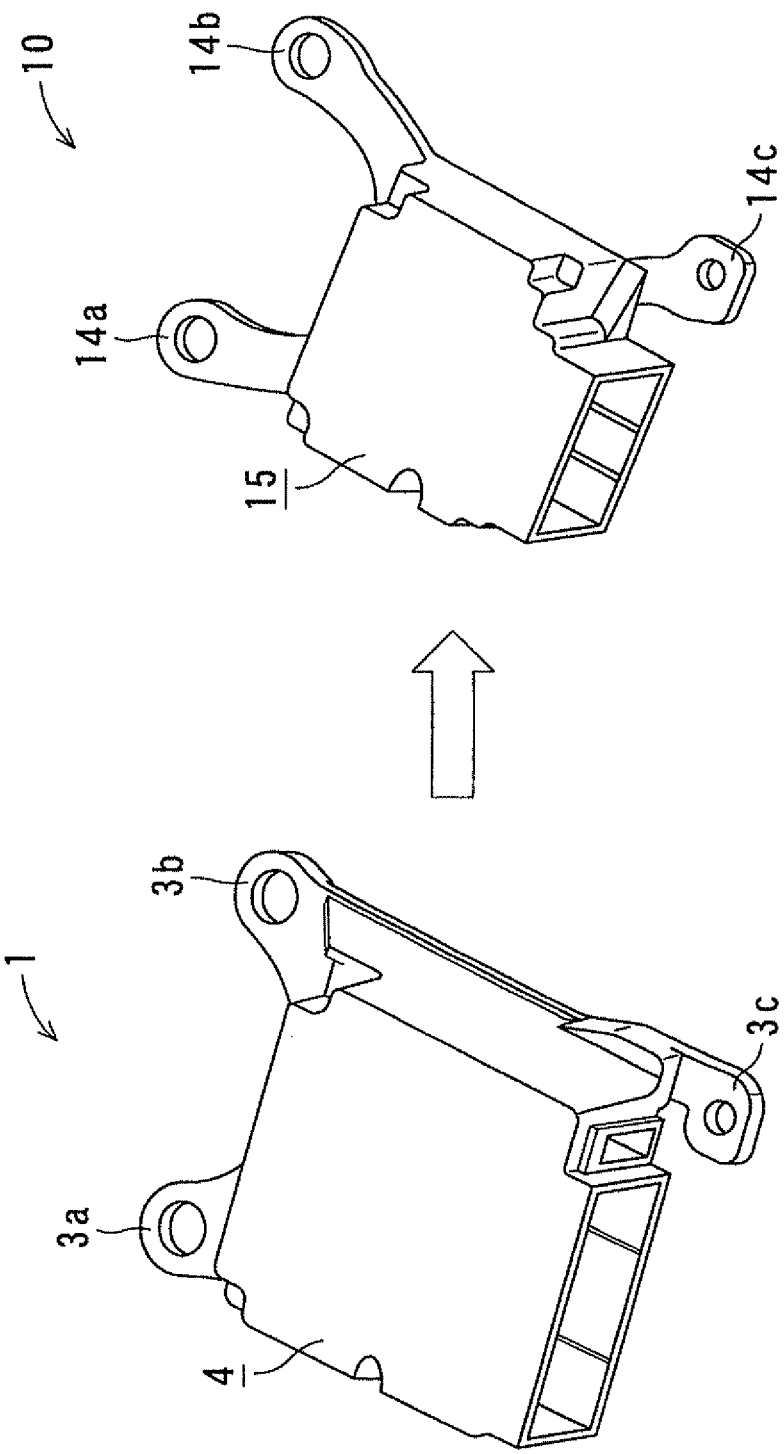
FIG. 3 is a perspective view for explaining the change of the structure of the airbag 10 shown in FIG. 2 due to the downsizing.
Figure 4:
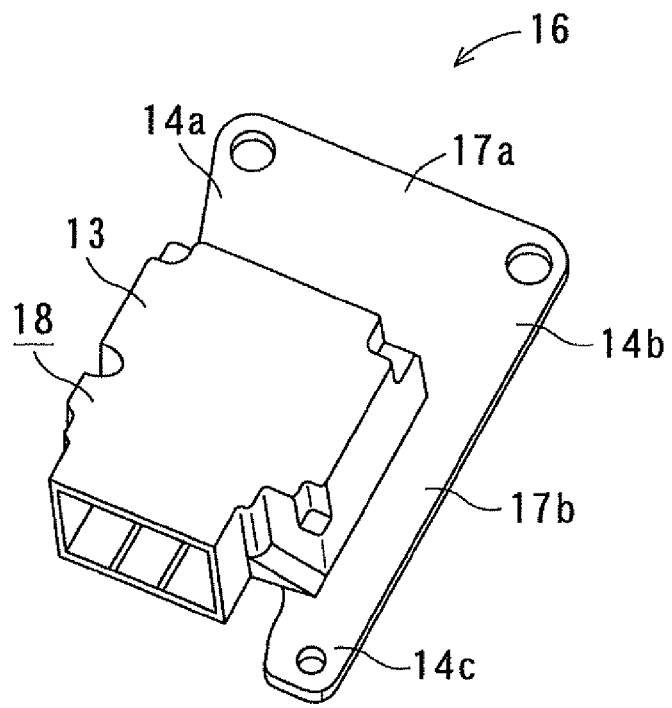
FIG. 4 is a perspective view illustrating an airbag ECU 16 according to a fourth related art.
Figure 5:
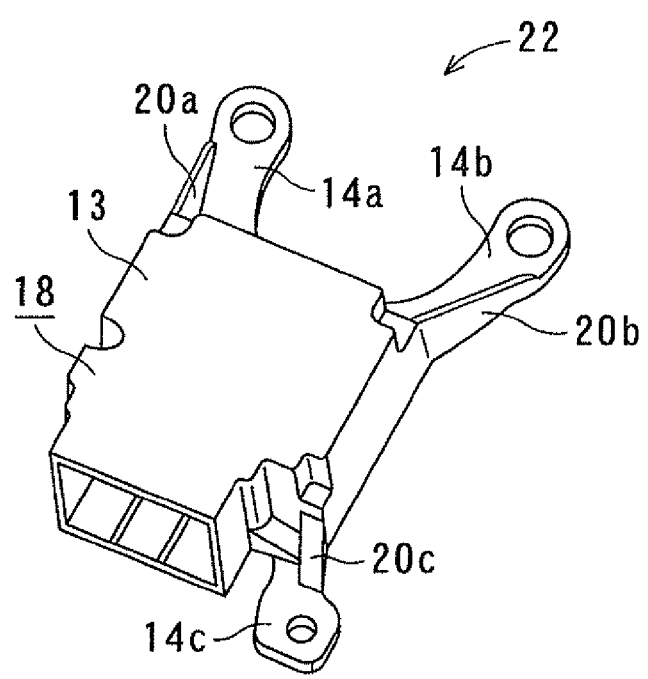
FIG. 5 is a perspective view illustrating an airbag ECU 22 according to a fifth related art.
Figure 13:
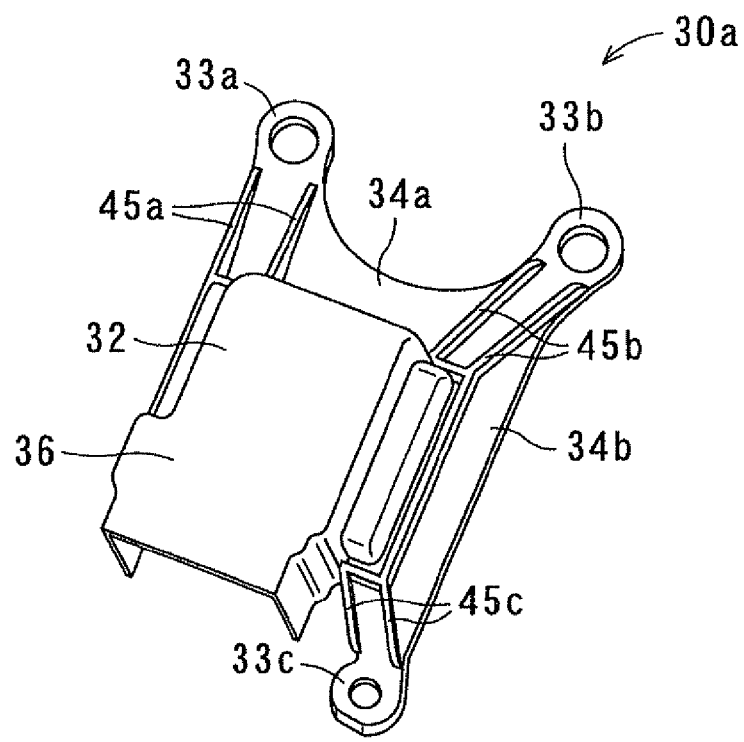
FIG. 13 is a perspective view illustrating a housing 30a of an airbag ECU according to another embodiment of the present invention.

Using a housing 30a according to an embodiment of the present invention, which is shown in FIG. 13 and will be discussed later and the related-art housing 10 shown at a right side in FIG. 3, a measurement test of the frequency characteristic was performed in order to confirm that the housing structure of this embodiment has a superior shock transmission performance. In this measurement test, the first and second brackets 33a, 33b was fixed and the third bracket 33c was vibrated in the vertical direction by a vibrator while changing the frequency from 0 Hz to 1000 Hz. And the resonance gain was calculated from an output of an accelerator mounted on the control board 6 accommodated in the case body 15, 32 of each housing 10, 30. This resonance gain represents the ratio (Vm/V0) of the output Vm of the acceleration sensor in the vibration state of the housings 10, 30a with respect to the output V0 in the non-vibration state.

The vertical direction is a direction in which the housings 10, 30a are vibrated. The sensitive directions X, Y, Z correspond to directions of sensitive directivity of the acceleration sensor mounted on the control board 6 in the airbag ECU, where X is a direction corresponds to a front and rear direction of the vehicle in an attachment surface, Y is a direction perpendicular to the X direction in the attachment surface, and Z is a direction perpendicular to the attachment surface.

Each curved line in FIG. 10 represents the gain in the X direction when each housing 10, 30a was vibrated in the vertical direction. Y direction corresponds to a left and right direction of the vehicle and Z direction corresponds to an up and down direction of the vehicle. Generally, only the sensitivity in the X direction is required for an airbag, the frequency characteristic in the X direction is used for the control of the airbag ECU. However, since the configuration of the housings 10, 30a has a high rigidity in the X direction (the front and rear direction), there was no remarkable change in the resonance gain when the housings 10, 30a are vibrated in the X direction. Accordingly, FIGS. 10 to 12 show the resonance gain with respect to the sensitivity characteristic in the X, Y, Z directions when the housings 10, 30a are vibrated in the Z direction (the up and down direction) where the resonance gain is likely to be remarkably changed.

As shown in FIG. 10, in the detection results of the acceleration sensor having a sensitivity characteristic in the X direction when the housings 10, 30a were vibrated in the vertical direction, a primary resonance occurred in the vicinity of 370 Hz in the related-art housing 10, whereas the primary resonance occurred in the vicinity of 620 Hz in the housing 30a according to the embodiment of the present invention. As shown in FIG. 11, in the detection results of the acceleration sensor having a sensitivity characteristic in the Y direction when the housings 10, 30a were vibrated in the vertical direction, the primary resonance occurred in the vicinity of 710 Hz in the related-art housing 10, whereas the primary resonance occurred in the vicinity of 770 Hz in the housing 30a according to the embodiment of the present invention. Further, as shown in FIG. 12, in the detection results of the acceleration sensor having a sensitivity characteristic in the Z direction when the housings 10, 30a were vibrated in the vertical direction, the primary resonance occurred in the vicinity of 705 Hz in the related-art housing 10, whereas the primary resonance occurred in the vicinity of 625 Hz in the housing 30a according to the embodiment of the present invention.

If the resonance point in which the signal gain is more than a predetermined value exists in a low frequency band in which is used in the control of the airbag, the control of the airbag cannot normally performed. However, in the embodiment of the present invention, since the gain was suppressed under the predetermined value in the low frequency band, there is no bad influence on the control of the airbag. Thus, it is possible to prevent the malfunction of the airbag.

FIG. 13 is a perspective view illustrating a housing 30a of an airbag ECU according to another embodiment of the present invention. The same reference numerals are applied to the same elements as the above described embodiment. In the housing 30a of this embodiment, a plurality of (two, in this embodiment) first reinforcement ribs 45a, a plurality of (two, in this embodiment) second reinforcement ribs 45b and a plurality of (two, in this embodiment) third reinforcement ribs 45c are formed along the first to third brackets 33a, 33b, 33c, respectively.

With this configuration, the bending rigidity of each bracket 33a, 33b, 33c can be improved and thus higher shock transmission performance can be obtained. Further, such a configuration can be employed when setting the attachment height of the first to third reinforcement ribs 45a, 45b, 45c to the respective side walls 37, 37b of the case body 32 low. The height of the each reinforcement ribs 45a, 45b, 45c can be adjusted to an optimum position relative to the height position of the control board 6.

Figure 14:
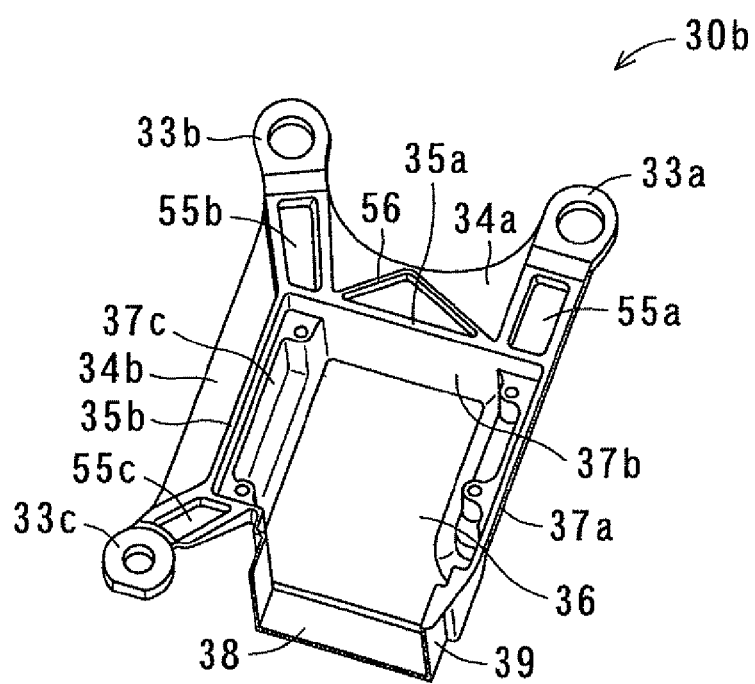
FIG. 14 is a perspective view illustrating a housing 30b of an airbag ECU according to still another embodiment of the present invention.

FIG. 14 is a perspective view illustrating a housing 30b of an airbag ECU according to still another embodiment of the present invention. The same reference numerals are applied to the same elements as the above described embodiments. In the housing 30b of this embodiment, recesses 55a, 55b, 55c which are opened to the attachment portion 50 are formed on the arm portions 40 of the first to third brackets 33a, 33b, 33c, respectively. A substantially X-shaped flange reinforcement rib is formed on a rear face of the flange portion 34a, which faces the attachment portion 50.

Also with this configuration, the bending rigidity of the first and second brackets 33a, 33b and the first flange portion 34a can be improved.

Figure 15:
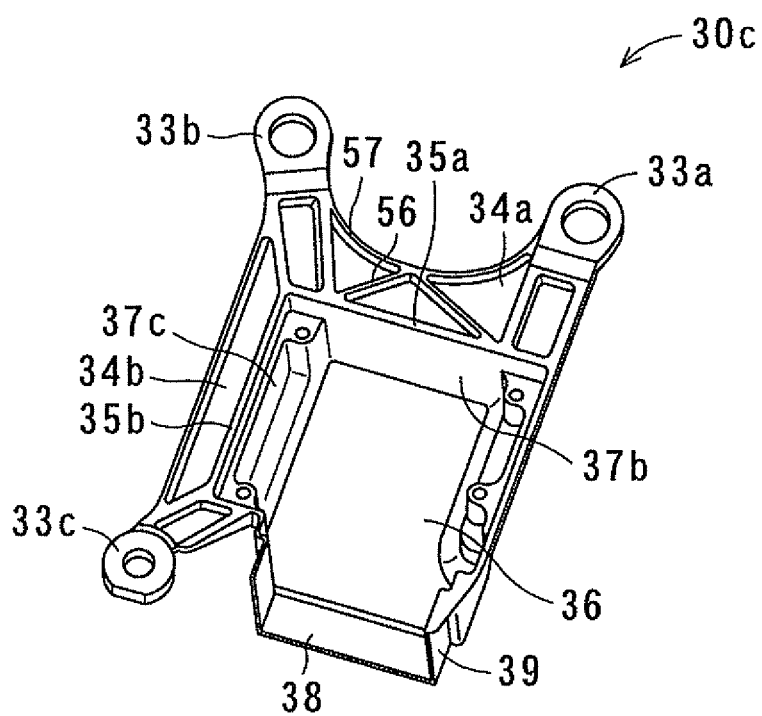
FIG. 15 is a perspective view illustrating a housing 30c of an airbag ECU according to yet another embodiment of the present invention.

FIG. 15 is a perspective view illustrating a housing 30c of an airbag ECU according to yet another embodiment of the present invention. The same reference numerals are applied to the same elements as the above described embodiments. In the housing 30c of this embodiment, a protrusion 57 projecting toward the attachment portion 50 relative the first and second flange portion 34a, 34b is formed on the opening peripheral edge portion of the case body 32.

Also with this configuration, a required bending rigidity can be guaranteed even when a chipped portion is formed by cutting or grinding for removing burr occurred during metal molding of the housing 30c.

Although the above described embodiments are directed to the housing for the airbag ECU, the present invention is not limited thereto. In the other embodiments of the present invention, for example, the housing can be used in the other in-vehicle electronic device such as an engine control unit.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A housing structure for an in-vehicle electronic device, comprising:
   a case body including:
      a top panel; and
      a side wall continuously and integrally formed at a side edge of the top panel;
   a plurality of brackets outwardly projecting and extending from the side wall of the case body and being fixed to an attachment portion of a vehicle body; and
   a plurality of reinforcement ribs outwardly projecting and extending from the side wall of the case body and being integrally formed on the brackets,
   wherein the reinforcement ribs are arranged such that the height of the reinforcement ribs gradually decreases from the side wall of the case body towards tip ends of the brackets and the reinforcement ribs are positioned lower than a control board which is accompanied in the case body in a state where the case body is mounted on the vehicle body.

2. The housing structure as set forth in claim 1,
   wherein the side wall of the case body includes first to third side walls which are continuously and integrally formed at least three side edges of the top panel,
   wherein the brackets includes:
      a first bracket which is fixed to the attachment portion of the vehicle body and is outwardly projecting and extending from an opening peripheral edge portion of the case body, at which the first side wall and the second side wall are intersected with each other;
      a second bracket which is fixed to the attachment portion of the vehicle body and is outwardly projecting and extending from an opening peripheral edge portion of the case body, at which the second side wall and the third side wall are intersected with each other; and
      a third bracket which is fixed to the attachment portion of the vehicle body and is outwardly projecting and extending from an end portion of the third side wall farthest from the opening peripheral edge portion of the case body, in a circumferential direction of the opening peripheral edge portion,
   wherein a first flange portion is formed in an opening edge portion which constitutes a part of the opening peripheral portion of the second side wall, the first flange portion which is formed between the first bracket and the second bracket and is formed into a shape being concave outward, and
   wherein a second flange portion is continuously formed in an opening edge portion which constitutes a part of the opening peripheral portion of the third side wall, the second flange portion which is formed between the second bracket and the third bracket and is formed into a shape being concave outward.

3. The housing structure as set forth in claim 2,
   wherein each of the first to third brackets includes:
      an arm portion which is continuously formed with the opening peripheral edge portion of the case body and extends in an out-of-plane direction; and
      a leg portion integrally formed in an free end of the arm portion and disposed on and supported by the attachment portion,
   wherein the arm portion is formed with a recess opened to the attachment portion.

4. The housing structure as set forth in claim 2, wherein a projection portion projecting toward a side of the attachment portion relative to the first and second flange portions is formed on the opening peripheral edge portion of the case body.

5. The housing structure as set forth in claim 2, wherein each of the reinforcement ribs includes a plurality of protrusions which extend along the first to third brackets.

6. The housing structure as set forth in claim 2, wherein a flange reinforcement rib is integrally formed on a rear face of the first flange portion, which faces the attachment portion.

7. The housing structure as set forth in claim 2, where a thick-walled portion projecting toward a side of the attachment portion is formed in a free end side edge portion of each of the first and second brackets.

8. The housing structure as set forth in claim 1, wherein the case body is comprised of a conducting material.

9. A housing structure for an in-vehicle electronic device, comprising:
   a case body configured to accommodate a board therein;
   a bracket outwardly projecting and extending from a side wall of the case body; and
   a reinforcement member outwardly projecting and extending from the side wall of the case body and being integrally formed on the bracket,
   wherein the reinforcement member is arranged such that the height of the reinforcement member gradually decreases from the side wall of the case body toward a tip end of the bracket and the reinforcement member is positioned lower than the board in a state where the case body is mounted on a vehicle body.

* * * * *